United States Patent [19]
Brighton et al.

[11] Patent Number: 4,789,885
[45] Date of Patent: Dec. 6, 1988

[54] SELF-ALIGNED SILICIDE IN A POLYSILICON SELF-ALIGNED BIPOLAR TRANSISTOR

[75] Inventors: Jeffrey E. Brighton, Katy; Deems R. Hollingsworth, Missouri City; Michael Welch, Sugar Land; Ronald E. McMann, Rosenberg; Manuel L. Torreno, Jr., Houston; Charles W. Sullivan, Plano, all of Tex.

[73] Assignee: Texas Instruments Incorporated, Dallas, Tex.

[21] Appl. No.: 12,977

[22] Filed: Feb. 10, 1987

[51] Int. Cl.⁴ .............................................. H01L 29/70
[52] U.S. Cl. ................................ 357/34; 148/DIG. 11; 148/DIG. 147; 357/71; 357/67
[58] Field of Search .................... 357/71, 34, 675; 148/DIG. 19, DIG. 147, DIG. 11

[56] References Cited

U.S. PATENT DOCUMENTS

| | | | |
|---|---|---|---|
| 4,583,106 | 4/1986 | Anantha et al. | 357/35 |
| 4,625,391 | 12/1985 | Sasaki | 357/71 X |
| 4,670,967 | 6/1987 | Hazuki | 148/DIG. 19 |
| 4,712,125 | 12/1987 | Bhatia | 357/34 X |
| 4,729,965 | 3/1988 | Tamaki et al. | 357/34 X |

*Primary Examiner*—R. R. Kucia
*Attorney, Agent, or Firm*—Thomas R. FitzGerald; Leo N. Heiting; Melvin Sharp

[57] ABSTRACT

A method of forming double polysilicon contacts to underlying diffused regions of a semiconductor body which includes forming first and second level electrically conductive silicon layers over the body which contact respective first and second diffused regions of the body. The diffused regions are formed such that said first diffused region is ringed by said second diffused region. The second silicon layer thus overlaps the first silicon layer. The top surfaces of the first and second silicon layers are silicided such that the silicide formed over the first silicon layer is aligned with the edge of the second silicon layer.

3 Claims, 5 Drawing Sheets

SELF-ALIGNED SILICIDE IN A POLYSILICON SELF-ALIGNED BIPOLAR TRANSISTOR

BACKGROUND OF THE INVENTION

The present invention relates to a self-aligned silicide process for use in a self-aligned double polysilicon process as a means of improving the performance of bipolar transistors.

Current bipolar technology is capable of fabricating transistors with dimensions below about 5 microns from one side to the other. Such reduced dimensions translate into high speed provided the effects of parasitic resistances and capacitances can be minimized. By using trench isolation in combination with a double polysilicon process, greatly reduced base resistance, collector-base capacitance, and collector-substrate capacitance can be achieved. One limiting factor to achieving further reductions in factors such as base resistance is the contact resistance in the polysilicon that is used to contact the base and emitter.

Accordingly, it is an object of the invention to provide a process for improving the double polysilicon process as used on bipolar transistors. It is a further object of the invention to provide a process that lowers the polysilicon contact resistance and thereby enhances transistor performance.

SUMMARY OF THE INVENTION

According to the invention there is provided a method of forming double polysilicon emitter and base contacts for a bipolar transistor which consists of depositing and patterning a first layer of polysilicon so as to contact a first diffused region. An insulator coating is formed over the first layer and a second layer of polysilicon is deposited to contact a second diffused region nested within the first diffused region and to overlap the first polysilicon layer. The insulator layer is patterned and etched to form an opening which is aligned to a periphery of the first layer. Both the second layer and the exposed area of the first layer of polysilicon are then silicided.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION WITH REFERENCE TO THE DRAWINGS

Figure 1:
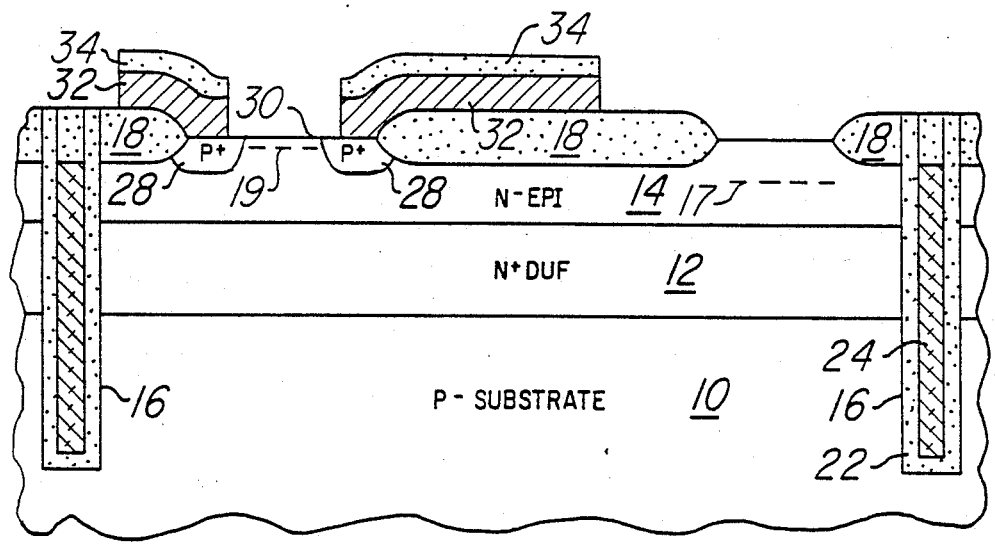
FIGS. 1–8 are cross sectional views, greatly enlarged showing the double polysilicon forming steps in accordance with a preferred embodiment of the invention.

Referring to FIG. 1 there is shown in cross section the structure of a high density bipolar transistor having an N+ DUF region 12 formed over a P-substrate 10 and and N-type epitaxial layer 14 formed over the N+ DUF region. A deep N+ collector contacting region 20 is implanted and diffused in the N-type epitaxial region 14 between field oxide isolation regions 18. In an adjacent area bounded by oxide isolation regions 18 are formed an intrinsic P-type base 26, an N+ diffused emitter region 30 in the base 26 and an extrinsic P+ base region 28 encircling the emitter 30. The entire structure is surrounded by a deep trench 16 having a thin oxide layer 22 and filled with polysilicon 24. The formation of such a structure is discussed in detail in a co-pending application assigned to Texas Instruments Incorporated and filed under Ser. No. 824,388 on Jan. 30, 1987, now abandoned and entitled "Polysilicon Self-aligned Bipolar Device and Process of Manufacturing Same". A continuation-in-part application of the latter was filed on Nov. 16, 1986 under Ser. No. 932,752.

Figure 2:
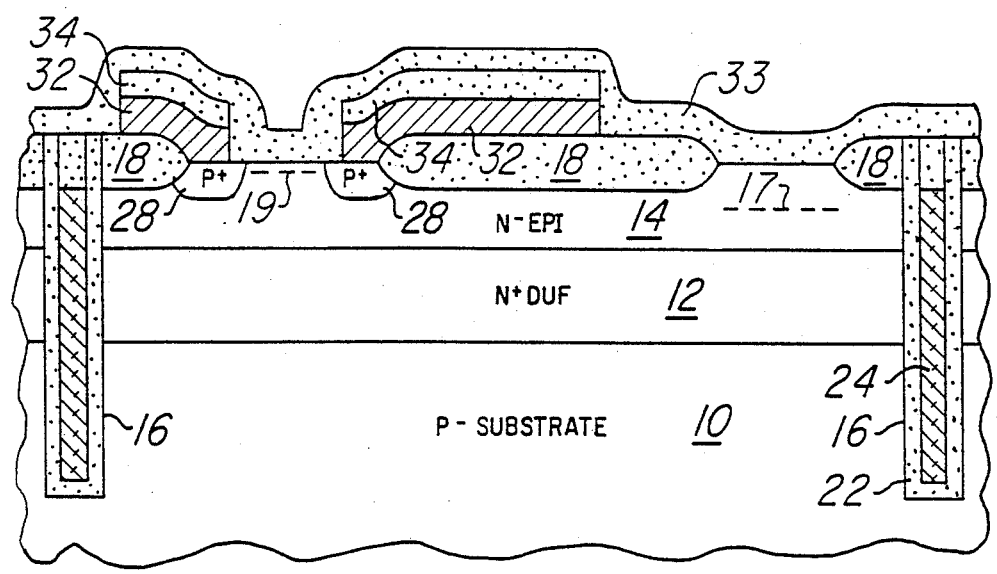
Figure 3:
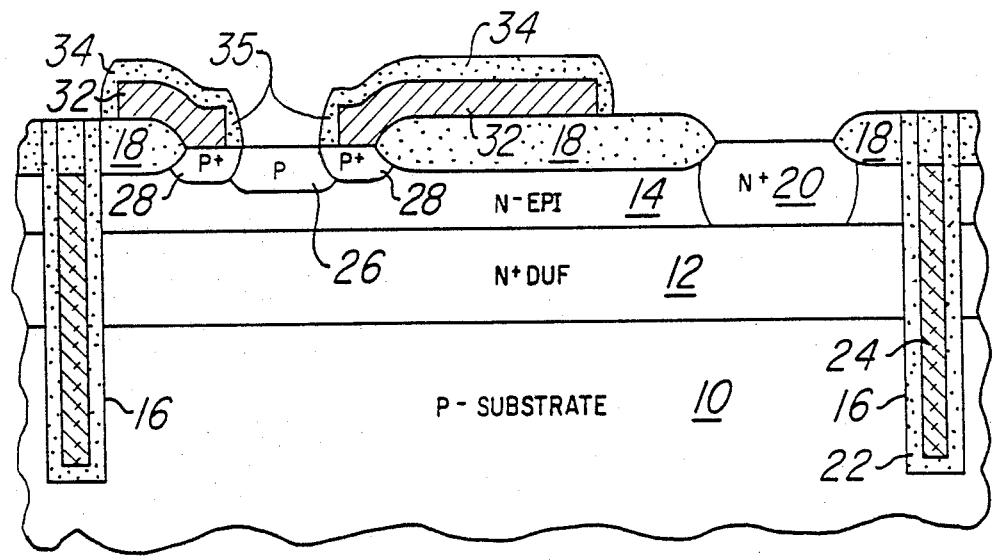

The double polysilicon process is applied to the latter structure by forming a first layer 32 of polysilicon doped with boron to a sheet resistance of 50 to 200 ohms per square to make it P+ conductivity type. Alternatively, amorphous silicon could be used instead of polysilicon. Layer 32 is then patterned and etched to the shape shown in FIG. 1 using an oxide mask 34. As shown in FIG. 2, next an oxide layer 33 is conformally deposited by a low pressure chemical vapor deposition. The oxide 33 is then etched back as seen in FIG. 3 with an anisotropic dry etch leaving sidewall oxide plugs 35 around the edges of the P+ doped polysilicon 32.

Figure 4:
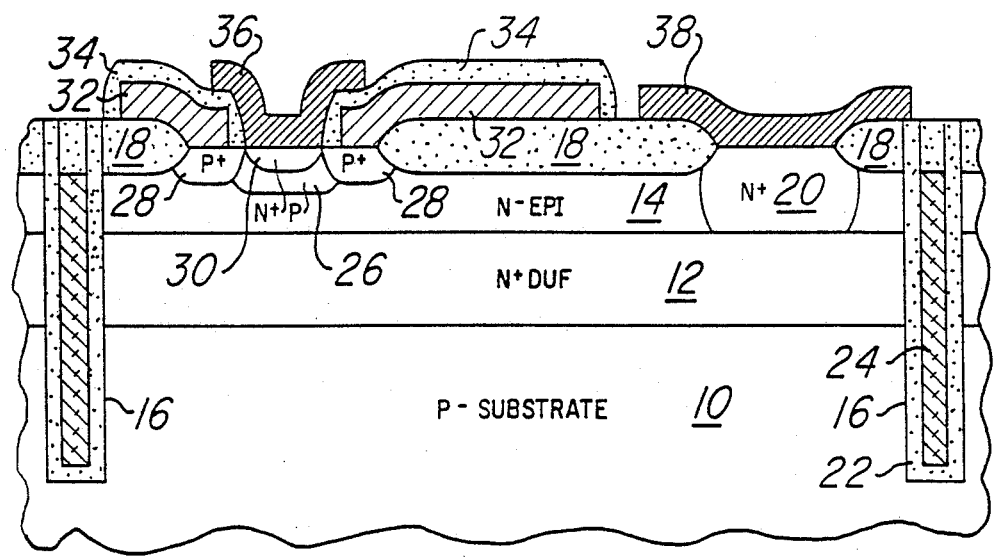

Next polysilicon is deposited over the slice by known methods and then doped N+ type by a phosphorous implant at an energy in the range of 80 to 100 keV and at a concentration in the range of $5 \times 10^{15}$ to $2 \times 10^{16}$ atoms per square centimeter. The polysilicon is then patterned and etched to form emitter 36 and collector 38 contacts as seen in FIG. 4. Heating the polysilicon 36 causes the phosphorous to drive down into the intrinsic base area 26 and form an N+ emitter region 30 therein. At the same time boron previously implanted into the first level of polysilicon diffuses into the epitaxial layer 14 to form extrinsic P+ conductivity base areas 28.

Figure 5:
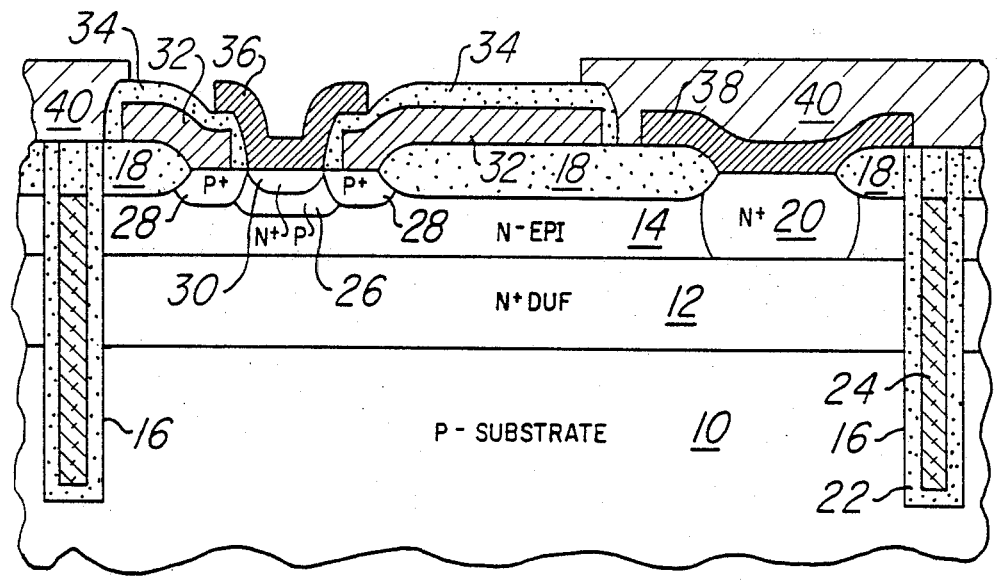

Photoresist 40 is deposited and patterned to define, in combination with emitter polysilicon 36, an area of base polysilicon 32 to be subsequently exposed as shown in FIG. 5. Oxide in the latter area is then etched with an etchant that selectively etches oxide over polysilicon so as to expose the area of polysilicon 32. The photoresist is then stripped.

Figure 6:
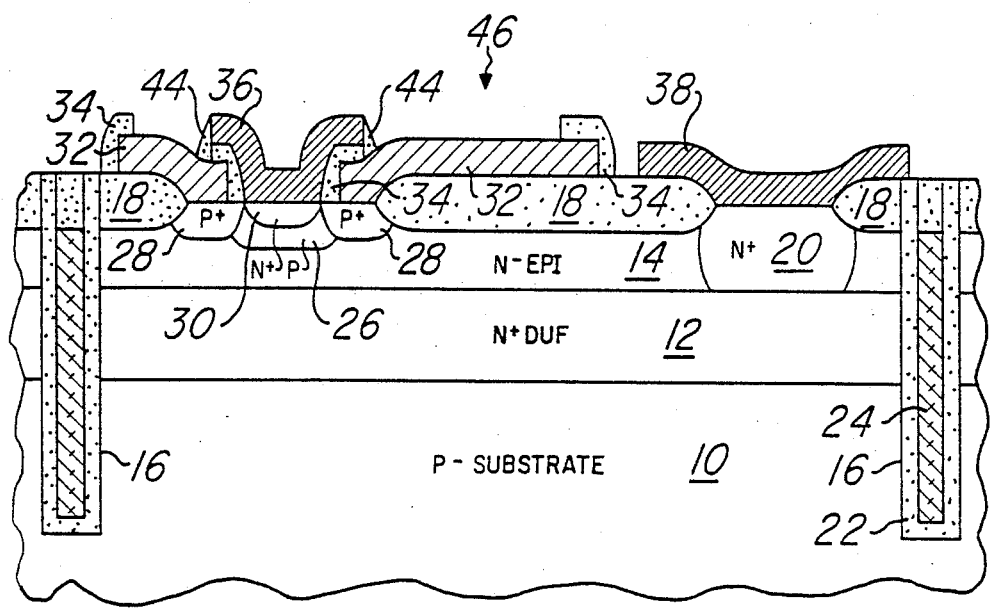

Optionally, a layer of oxide may then be deposited by low pressure chemical vapor deposition and then etched back by an anisotropic dry etch to leave sidewall plug 44 around the edge of the emitter polysilicon 36 as shown in FIG. 6. Such a plug is desirable to reduce the risk of filament formation bridging a subsequently formed silicide layer on the emitter polysilicon contact 36 with one formed on the base polysilicon contact 32.

Figure 7:
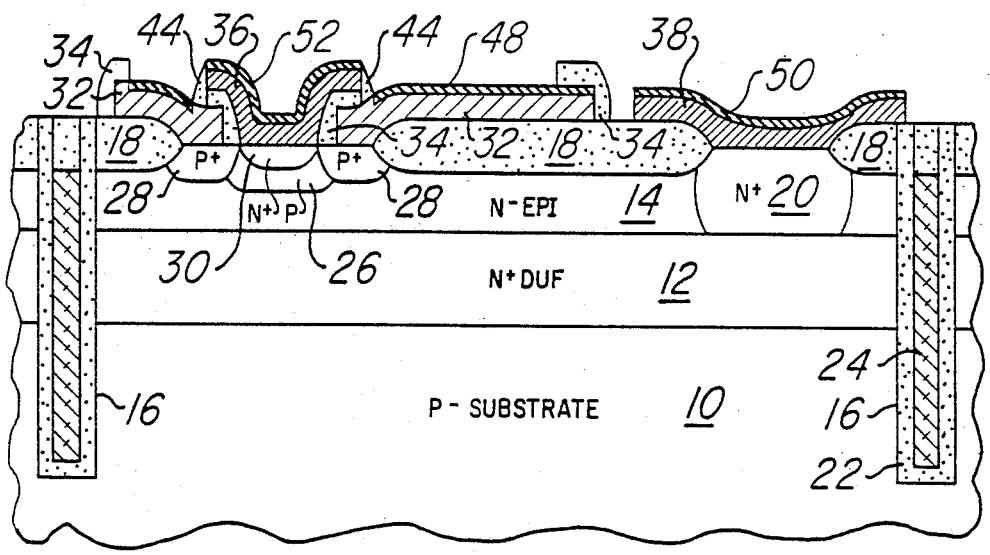

A layer of platinum (or other suitable metal which can form silicide with silicon) is sputtered over the slice and then heated up to a temperature at which the deposited platinum in contact with the polysilicon reacts with the latter to form platinum silicide. The unreacted platinum is then cleared by a suitable etchant leaving silicide layers 52, 48 and 50 over the emitter 36, base 32 and collector 38, respectively, as shown in FIG. 7. Although platinum is a preferred metal, other metals such as titanium, cobalt, tungsten, etc. could be used.

Figure 8:
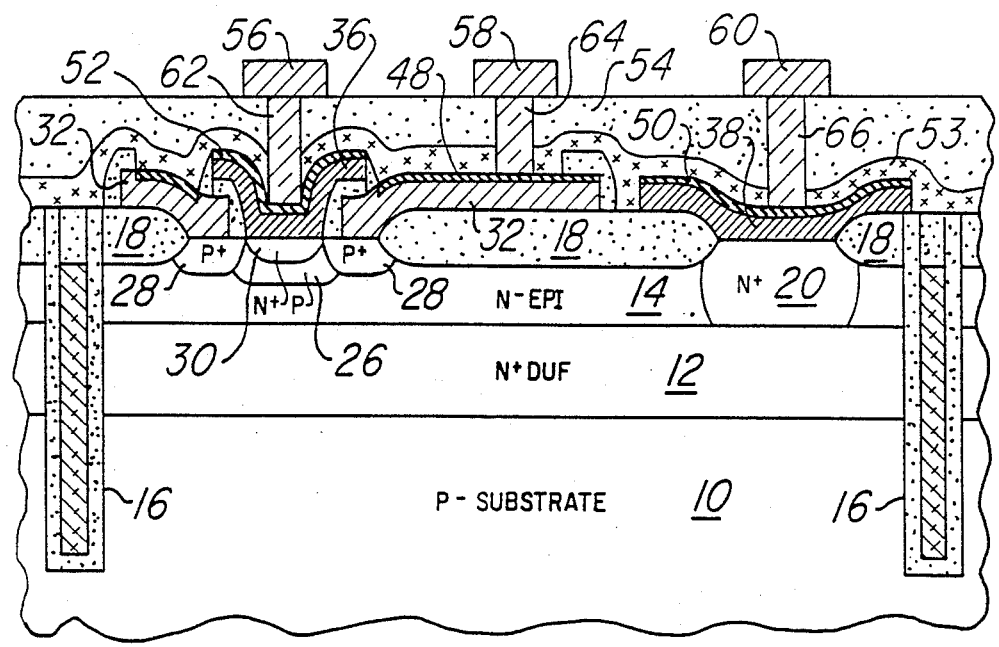

A layer of phosphosilicate glass (PSG) 53 is then deposited for stabilization. Subsequently, metal contacts are formed by first depositing an insulator layer 54 such as plasma oxide, planarizing the latter, patterning and etching openings to the silicided areas, resistor contacts (not shown) and Schottky diodes (not shown) and sputtering over the openings a sticking layer such as a mixture of titanium and tungsten, or tungsten silicide which is designed to enhance bonding of a subsequently deposited tungsten layer to underlying surfaces. Next tungsten is conformally deposited over the surface and openings until the openings are filled. The tungsten on the top surface is then planarized and etched back and aluminum leads 56, 58 and 60 formed over the corresponding tungsten plugs 62, 64 and 66 as shown in FIG. 8.

Figure 9:
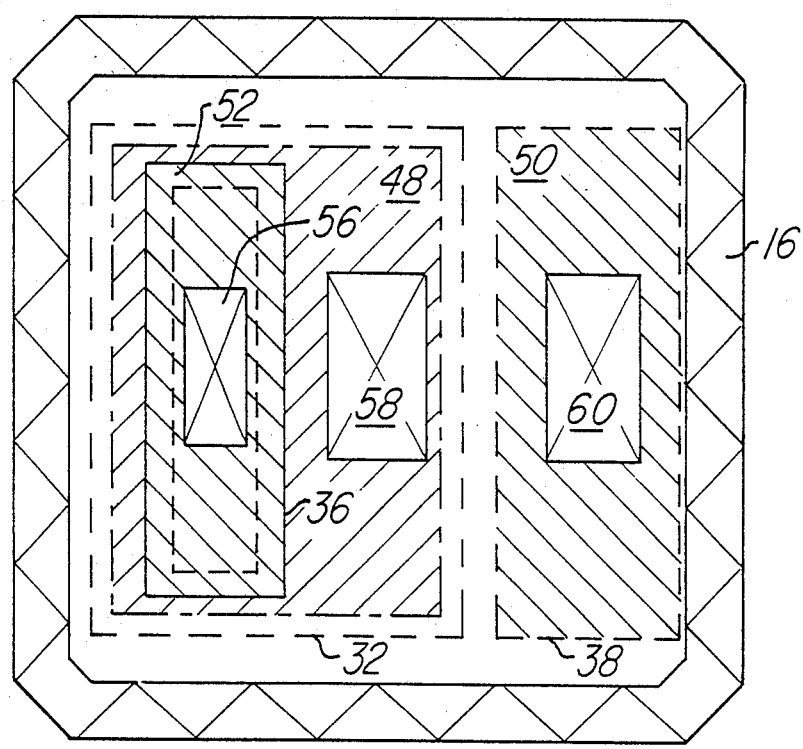
FIG. 9 is a plan view of the structure of FIG. 8 showning the polysilicon contacts.

As shown in FIG. 9, the base polysilicon silicided area 48 rings the emitter silicided area 52 providing a substantially equipotential surface therearound. The large amount of polysilicon area that is silicided maximizes the amount of polysilicon in line between the underlying diffused area and the tungsten plug that is effective in conducting current. Thus, the polysilicon becomes a low resistance local interconnect.

Clearly, the technique is applicable to any double polysilicon process and is not limited to the particular structure disclosed herein.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

We claim:

1. A bipolar transistor device having base and emitter diffused regions formed in a body thereof, comprising:
   a first level of electrically conductive silicon contacting a diffused base region thereof;
   a second level of electrically conductive silicon contacting a diffused emitter region thereof self-aligned with and nested within said diffused base region, said second level partially overlapping said first level of silicon;
   silicide layers formed over top surfaces of said first and second level of silicon such that the silicide over said first level is aligned with an outer edge of said second level of silicon.

2. A device according to claim 1, wherein a side wall oxide layer is formed over a sidewall of said second level of silicon prior to silicide being formed over said first level so as to prevent bridging between silicide on said first level and that on said second level of silicon.

3. A device according to claim 1, further comprising an insulating region adjacent said diffused base region, the first level of electrically conductive silicon contacting said insulating region and said silicide layer on the top surface of said first level of electrically conductive silicon extending over a portion of said level above said insulating region for providing an elongated, low resistance local electrical interconnection between the base diffused region and the silicide layer on the top surface of the first layer of conductive silicon.

* * * * *